US012563678B2

(12) United States Patent
Rauchschwalbe et al.

(10) Patent No.: US 12,563,678 B2
(45) Date of Patent: Feb. 24, 2026

(54) PROCESSING APPARATUS FOR CONTROLLING, MEASURING AND REGULATING

(71) Applicant: Schenck Process Europe GmbH, Darmstadt (DE)

(72) Inventors: Ulrich Rauchschwalbe, Gross-Zimmern (DE); Bernd Allenberg, Muehltal (DE); Dino Bohrmann, Mannheim (DE); Harald Dittrich, Ginsheim-Gustavsburg (DE)

(73) Assignee: Qlar Europe GmbH, Darmstadt (DE)

( * ) Notice: Subject to any disclaimer, the term of this patent is extended or adjusted under 35 U.S.C. 154(b) by 308 days.

(21) Appl. No.: 17/836,695

(22) Filed: Jun. 9, 2022

(65) Prior Publication Data

US 2022/0304168 A1    Sep. 22, 2022

Related U.S. Application Data

(63) Continuation of application No. PCT/EP2020/085471, filed on Dec. 10, 2020.

(30) Foreign Application Priority Data

Dec. 10, 2019    (DE) .................... 10 2019 133 746.1

(51) Int. Cl.
| | |
|---|---|
| *H05K 5/00* | (2006.01) |
| *G05B 19/042* | (2006.01) |
| *H05K 7/10* | (2006.01) |

(52) U.S. Cl.
CPC ....... *H05K 5/0017* (2013.01); *G05B 19/0423* (2013.01); *H05K 7/1084* (2013.01); *G05B 2219/2642* (2013.01)

(58) Field of Classification Search
CPC ...... H05K 5/0017; H05K 7/10; H05K 7/1084; H05K 7/14; H05K 7/1411; H05K 7/1418;
(Continued)

(56) References Cited

U.S. PATENT DOCUMENTS

| | | | | |
|---|---|---|---|---|
| 6,049,449 A * | 4/2000 | Cranston, III | .......... | G06F 1/186 361/801 |
| 6,181,563 B1 * | 1/2001 | Shimbo | .................. | B60K 35/00 361/736 |

(Continued)

FOREIGN PATENT DOCUMENTS

| | | |
|---|---|---|
| DE | 9207546 U1 | 7/1993 |
| DE | 20307308 U1 | 7/2003 |

(Continued)

OTHER PUBLICATIONS

International Search Report dated Feb. 9, 2021 in corresponding application PCT/EP2020/085471.
(Continued)

*Primary Examiner* — Tuan T Dinh
(74) *Attorney, Agent, or Firm* — Muncy, Geissler, Olds & Lowe, P.C.

(57) ABSTRACT

A processing apparatus for controlling, measuring and/or regulating, comprising an appliance for installation for output and/or input, with an intermediate housing, a unit for display and/or operation, and a main board connected to the unit having a central computer unit, wherein the appliance for installation is provided for use in a device or for a device such as a weighing device, metering device, conveying device, screening device, grinding device, mixing device, filter device, status monitoring device and/or material analysis device, wherein the main board serves as an electronic platform regardless of use and has, for each use, a particular combination of interfaces to the device in question. Furthermore, the invention relates to a processing apparatus for
(Continued)

controlling, measuring and/or regulating having such an appliance for installation.

15 Claims, 4 Drawing Sheets

(58) Field of Classification Search
CPC .. H05K 7/1421; H05K 7/1427; G05B 19/042;
G05B 19/0423
USPC ......... 361/724–730, 752–753, 756, 796–802
See application file for complete search history.

(56) References Cited

U.S. PATENT DOCUMENTS

| | | | | |
|---|---|---|---|---|
| 6,742,068 | B2 * | 5/2004 | Gallagher | G06F 9/4406 |
| | | | | 710/301 |
| 6,827,589 | B2 * | 12/2004 | Lin | G06F 1/189 |
| | | | | 439/76.1 |
| 6,975,508 | B2 | 12/2005 | Hoegener et al. | |
| 7,031,168 | B2 * | 4/2006 | Kato | G05B 19/0421 |
| | | | | 174/250 |
| 7,177,709 | B2 | 2/2007 | Uhlendorf et al. | |
| 7,193,863 | B2 * | 3/2007 | Tullidge | H05K 7/1424 |
| | | | | 361/801 |
| 7,342,807 | B2 * | 3/2008 | Mueller | H05K 7/1425 |
| | | | | 361/728 |
| 7,539,023 | B2 * | 5/2009 | Bulucea | H01R 12/52 |
| | | | | 361/796 |
| 7,898,819 | B2 * | 3/2011 | Pfingsten | H05K 7/1427 |
| | | | | 361/730 |
| 8,345,439 | B1 * | 1/2013 | Goergen | H05K 7/1458 |
| | | | | 361/792 |
| 8,902,607 | B1 * | 12/2014 | Chang | G06F 1/16 |
| | | | | 361/679.01 |
| 9,470,720 | B2 * | 10/2016 | Dean | G01R 1/44 |
| 10,795,341 | B2 | 10/2020 | Seitz et al. | |
| 2002/0118514 | A1 * | 8/2002 | Coglitore | G06F 1/18 |
| | | | | 361/724 |
| 2006/0126274 | A1 * | 6/2006 | Iwano | B60R 11/02 |
| | | | | 361/600 |
| 2010/0259899 | A1 * | 10/2010 | Facusse | H05K 7/20809 |
| | | | | 361/752 |
| 2011/0292769 | A1 * | 12/2011 | Snider | H05K 9/0045 |
| | | | | 368/47 |
| 2017/0285604 | A1 | 10/2017 | Al-Jandal | |

FOREIGN PATENT DOCUMENTS

| | | |
|---|---|---|
| DE | 20310087 U1 | 3/2004 |
| EP | 1372366 A2 | 12/2003 |
| EP | 3309637 A1 | 4/2018 |

OTHER PUBLICATIONS

SHPI Technische Produktinformation, Smart Home Peripheral Interface—zero—AC Version—status Oct. 5, 2019, retrieved Oct. 28, 2020; relevant sections cited in German Office Action dated Oct. 30, 2020: pp. 2-4.

German Office Action dated Oct. 30, 2020in corresponding applciation 10 2019 133 746.1—partial translation identifies relevant portion of cited document SHPI Technische Produktinformation, Smart Home Peripheral Interface—zero—AC Version.

* cited by examiner

Central Computer Unit 41

Signaling or Signal Processing Device

Signaling or Signal Processing Device

PROCESSING APPARATUS FOR CONTROLLING, MEASURING AND REGULATING

This nonprovisional application is a continuation of International Application No. PCT/EP2020/085471, which was filed on Dec. 10, 2020, and which claims priority to German Patent Application No. 10 2019 133 746.1, which was filed in Germany on Dec. 10, 2019, and which are both herein incorporated by reference.

BACKGROUND OF THE INVENTION

Field of the Invention

The present invention relates to a processing apparatus for controlling, measuring and regulating, comprising an appliance for installation for output, for example of information, and/or for input, for example of control commands. The appliance for installation for output and/or input is hereinafter also referred to as an output and/or input device.

Description of the Background Art

Processing apparatuses with appliances for installation, which are used, for example, for controlling, monitoring, detecting and/or regulating processes, machines and/or systems, are generally known from the prior art.

A major disadvantage of the known processing apparatuses, however, is often that either a large number of apparatuses and/or appliances for installations are necessary for multiple uses or that the respective appliance for installation is not optimally suited for the planned use or must be laboriously adapted to the use.

SUMMARY OF THE INVENTION

It is therefore an object of the present invention to provide a processing apparatus (for data) comprising an appliance for installation for output and/or input.

The appliance for installation or the output and/or input device is used to output information from the measuring, control and regulation processes of the systems connected to the appliance for installation. Accordingly, the appliance for installation is used for entering data, an authentication, a parameter, an order number or for initiating a process. The appliance for installation has an intermediate housing. Furthermore, the appliance for installation has a unit for display, for example, of the information, and/or for operation, for example, for entering the control commands. The unit for display and/or operation is hereinafter also referred to as a display and/or operating unit. The unit is preferably fastened, i.e., firmly attached to the intermediate housing. The unit for display and/or operation serves as an interface to a user. Depending on the industrial environment in which the appliance for installation is used, the display and/or operating unit can be used combined as a touch screen or as a screen or monitor with a separate keyboard. In addition, the appliance for installation has a motherboard. The motherboard, which can also be referred to as a main board or module carrier with processor, is preferably attached to the intermediate housing or received in the intermediate housing. The main board has a central computer unit. In particular, the computer unit is electronically connected to the display and/or operating unit. According to the invention, the appliance for installation is provided for use in a signaling or signal processing device or for a signaling or signal processing device such as a weighing device, metering device, conveying device, screening device, grinding device, mixing device, filter device, status monitoring device and/or material analysis device. The main board is used as an electronic platform regardless of use, i.e., for each device from the group. This means that the main board of the appliance for installation is the same for all devices. This presents the advantage that at any time another device can be connected to the appliance for installation and be controlled, operated, etc. by said appliance for installation without the need for making changes to the electronic platform of the main board. In other words, the appliance for installation can be used in a modular manner in several and/or different ways. The main board has at least one analog interface and/or at least one digital interface, for example for data transmission to the device in question. Preferably, the main board has several interfaces, analog and/or digital, so that several devices can be connected simultaneously or alternately. As a result, each interface can be adapted to the device in question, which is connected to the main board via the respective interface. The main board therefore serves as an electronic platform regardless of use and has, for each use, a particular combination of interfaces to the device in question.

Preferably, the interface may be designed to connect a USB WLAN stick, a USB Bluetooth stick, a USB radio module and/or a USB Ethernet stick. As a result, data of the devices in question can be transmitted to the main board using various, conventional data transmission standards. Preferably, the data of the device in question is processed in the central computer unit of the main board and displayed via the display and/or operating unit. In addition, for example, data and/or control commands entered by the user via the control unit can preferably be processed in the central computer unit of the main board and sent through the interface, by data transmission, to the device in question. In addition to the interfaces already described, the main board has one or more input interfaces for receiving and connecting a function module.

The function module can also be referred to as an application module. Preferably, each function module is formed by an option card that can be plugged into the input interface of the main board. By connecting the function module to the main board, different functions can be realized. The appliance for installation is modularly equipped with one or more function modules selected from a variety of function modules. As a result, the appliance for installation can be configured customer-specifically in a particularly simple way. By selecting the respective function module, the processing apparatus which serves as the base platform becomes a particular device for controlling, measuring and/or regulating which is adapted to a process. Accordingly, each function module in turn includes one or more specific interfaces to the device in question.

The function module, or the function modules, can be non-destructively connected to the input interface, preferably via a plug connection, and non-destructively detached from the input interface. Thus, the range of functions of the appliance for installation and/or the processing apparatus defined by the function modules, in particular the type and number of function modules, can be advantageously, optimally adapted to the customer and also to changing requirements or conditions.

According to the invention, thus, a processing apparatus is provided comprising an output and/or input device which is designed such that it can be used in a modular manner for weighing devices, metering devices, conveying devices, screening devices, grinding devices, mixing devices, filter devices, status monitoring devices and/or material analysis devices. This allows for a plurality of the named devices to be operated, controlled and/or monitored using a common processing apparatus or a common output and/or input device.

The processing apparatus for controlling, measuring and/or regulating is hereinafter also referred to as controller, control device, measuring device and/or regulating device. As previously mentioned, a function module in turn includes interfaces to the device in question, for whose control, regulation or measurement the processing apparatus is used. For example, a function module can be a load cell module for a discontinuous scale, inter alia a vehicle scale, and include interfaces to one or more load cells and/or one or more proximity sensors.

The display and/or operating unit may be non-destructively, form-fittingly connected to the intermediate housing and be non-destructively detachable from the intermediate housing. For example, the display and/or operating unit may be connected to the intermediate housing by a clip connection or a snap-in connection. This provides an easy-to-install, easily detachable and secure connection between the components of the appliance for installation. Preferably, the display and/or operating unit is arranged such that it covers the main board. As a result, the main board is protected from the environment and from outside influences, but at the same time remains easily accessible due to the detachable connection of the display and/or operating unit to the intermediate housing.

The intermediate housing can have guides in which the function modules are received. In other words, the function module or the function modules may be guided in the intended guides of the intermediate housing. For example, the guides can be designed as rails on which the function modules rest. Preferably, the function modules are arranged on top of each other or next to each other. As a result, a guided and compact arrangement of the function modules in the intermediate housing can be ensured.

The appliance for installation can have a back wall, which can preferably be form-fittingly, non-destructively connected to the intermediate housing and non-destructively detached therefrom. For example, the back wall can be a connected to the intermediate housing by a clip connection or a snap-in connection. Preferably, the back wall is designed to cover the main board.

The back wall may have cover plates, for example plates that can be separated out or broken off. The cover plates are designed with regard to their geometry in such a way that they each cover an interface (for a device) or an input interface (for a function module) of the main board. Thus, the stiffness of the back wall can be improved, since the cover plates are only so large that when they are separated out, the respective interface or input interface is accessible, and that only those cover plates need to be separated out which cover an interface or input interface that is in use. For example, the cover plates can provide a tool interface to which a tool for separating the respective cover plate can be fitted. The tool interface can be designed as a slot.

The appliance for installation and/or the display and/or operating unit can be designed so as to be rotatable about an axis perpendicular to a screen of the display and/or operating unit, preferably by 180° or 90°, or be attached so as to be rotatable by 180° or 90°. This presents the advantage that the screen, for example depending on the method of attachment, can be optimally aligned for the user.

Furthermore, it is advantageous if the appliance for installation is, preferably frictionally, connectable to an outer housing of the processing apparatus and/or to a retaining frame of the processing apparatus. For example, the appliance for installation can be housed in the outer housing.

The outer housing can be designed in several parts. The components of the outer housing are connectable to each other in a manner that they are preferably form-fitting and can be detached from each other.

In addition, it is expedient if the appliance for installation can be attached in the outer housing either in a first position, or in a second position rotated by 180° about an axis perpendicular to the screen of the unit. Thus, the user is provided with a great deal of flexibility in terms of use.

The outer housing, in which the appliance for installation is housed, can preferably be attached to a wall, or placed on a table. This way, the processing apparatus can be mounted adapted to the spatial conditions.

The outer housing can have safety ropes, preferably nylon ropes, for attaching components of the outer housing to each other which can be detached from one another. As a result, when opening the outer housing or when detaching the components from each other, the risk of damage is reduced if a component falls off.

Furthermore, it is an advantage if the intermediate housing is designed as a tube housing, which has at least a cuboid-shaped interior space for receiving at least one function module or several function modules and/or the interfaces. This way, the electronic, often highly sensitive, components can be adequately protected.

Furthermore, it is advantageous if the back wall is adapted to the shape of the intermediate housing, in particular the tube housing, and accordingly serves as a ground connection for all modular function modules.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

The figures are merely schematic in nature and are exclusively intended for understanding the invention. Identical elements are labeled with the same reference signs. Features of different embodiments can be exchanged with each other.

Figure 1:
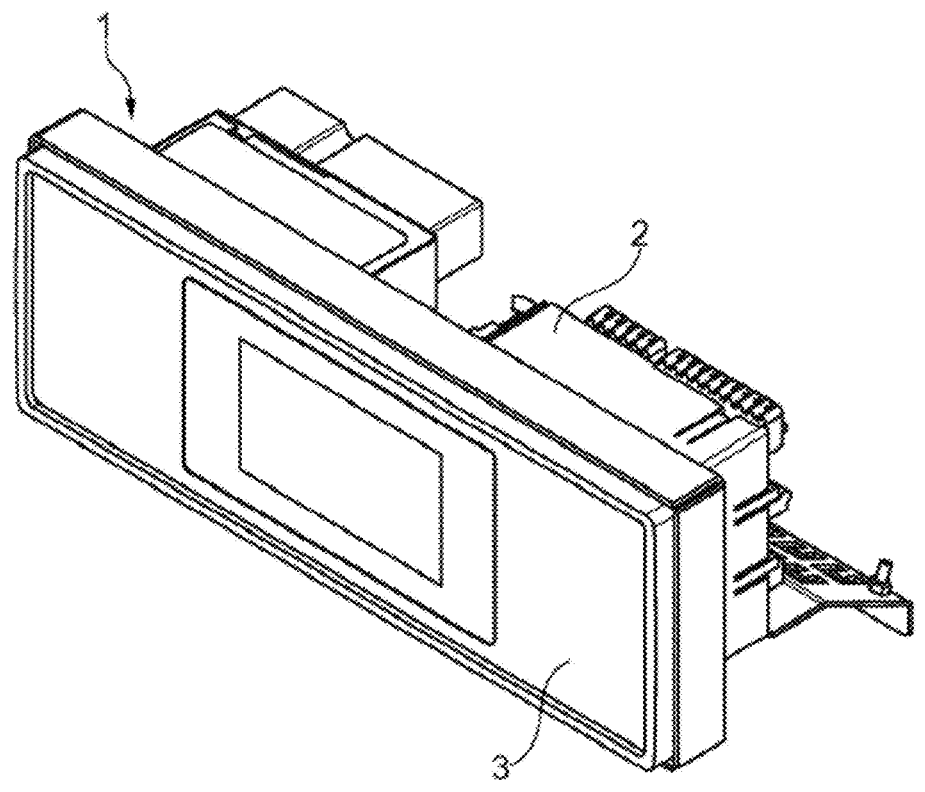
FIG. 1 is a perspective view of an inventive appliance for installation.

FIG. 1 shows an appliance for installation 1 for a processing apparatus according to the invention. The appliance for installation 1 is also used as an input and/or output device. The appliance for installation 1 has an intermediate housing 2, a unit 3 for display and/or operation and a main board 4 connected to the unit 3. The main board 4 has a central computer unit 41 (see FIG. 2). According to the invention, the processing apparatus comprising the appliance for installation 1 is provided for use in a device or for a signaling or signal processing device, such as a weighing device, metering device, conveying device, screening device, grinding device, mixing device, filter device, status monitoring device and/or material analysis device. The main board 4 serves as an electronic platform regardless of use and has, for each use, a particular combination of interfaces to the device in question. These interfaces can be either analog or digital. The components of the appliance for installation 1 are described in detail with reference to the following figures.

Figure 2:
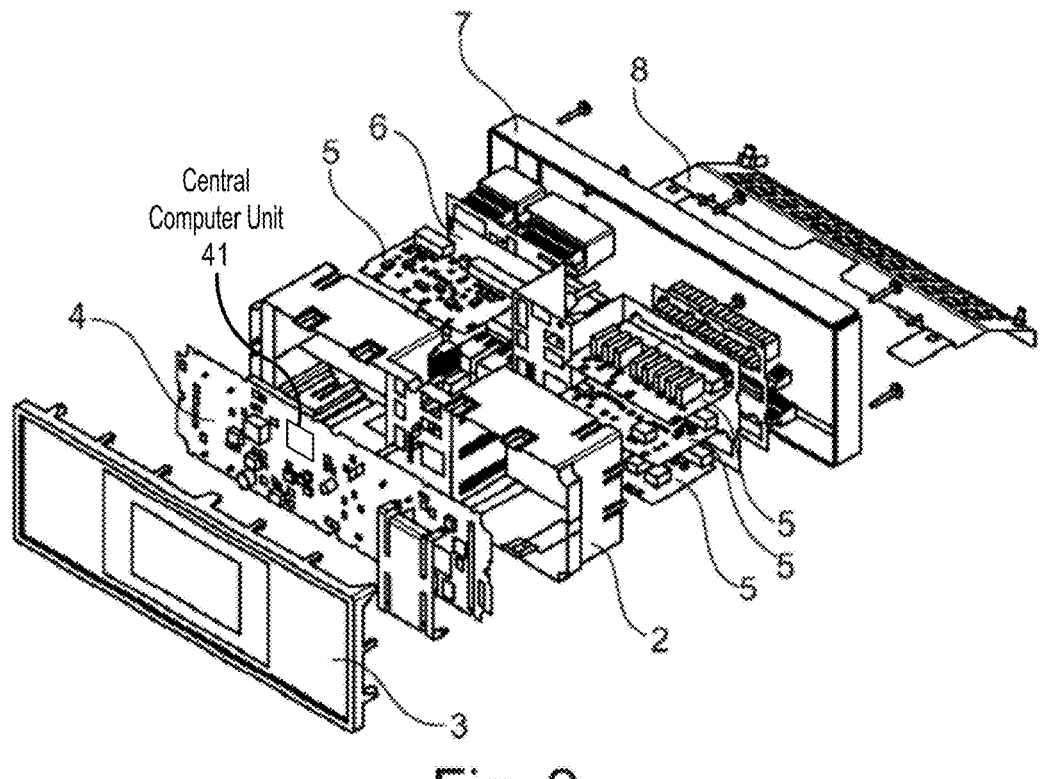
FIG. 2 is an exploded view of the appliance for installation.

FIG. 2 shows the individual parts of the appliance for installation 1. At the front is the unit 3 for display and/or operation. Behind it is the main board 4 that has the central computer unit 41. The main board 4 is attached to the intermediate housing 2. The appliance for installation 1 also has at least one function module 5, here, several function modules 5. The function modules 5 are mounted in the intermediate housing 2 in the assembled state and connected to the main board 4. The appliance for installation 1 also has a back wall 6, which covers the intermediate housing 2. The appliance for installation 1 can, as shown in FIG. 2, be connected to a retaining frame 7. Furthermore, the appliance for installation 1 has a shield plate 8, which also serves as a cable interceptor. The shield plate 8 is connected to the back wall 6. The shield plate 8 performs a shielding and/or grounding function.

Figures 3, 4, 5, 6, 7:
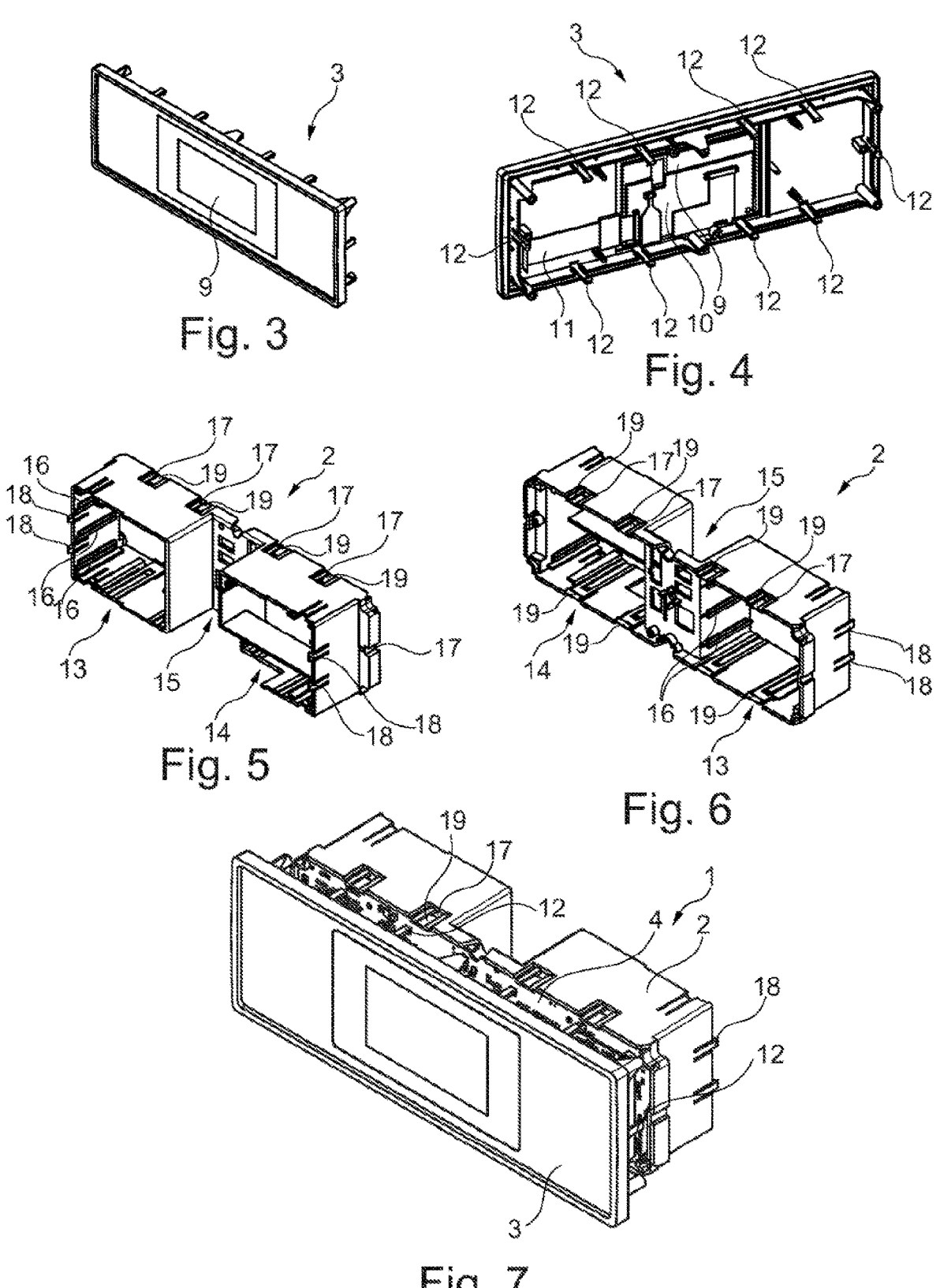
FIGS. 3 and 4 are perspective views of a unit for display and/or operation of the appliance for installation.
FIGS. 5 and 6 are perspective views of an intermediate housing of the appliance for installation.
FIG. 7 is a perspective view of the appliance for installation during assembly.

FIGS. 3 and 4 show the unit 3 for display and/or operation, which is also referred to as a display and/or operating unit or as a display unit. The unit 3 has a screen 9. The screen 9 can be designed as a touch screen or as a conventional screen. An adapter board 10 is attached to a back side of the screen 9. The unit 3 is connected to the main board 4. In particular, the adapter board 10 can be connected to the main board 4 by means of a ribbon cable connection and a connected ribbon cable 11. The unit 3 is form-fittingly attached to the intermediate housing 2. For this purpose, the unit 3 has a clip connection component that interacts with a counter component of the clip connection on the intermediate housing 2 for fastening. The clip connection is non-destructively detachable. The clip connection component is connected to the unit 3 by means of several snap hooks 12.

FIGS. 5 and 6 show the intermediate housing 2. In the embodiment shown, the intermediate housing 2 is designed as a tube housing. The intermediate housing 2 has a cuboid first interior space 13. The interior space 13 is used to house one or more function modules 5. The intermediate housing 2 has a cuboid second interior space 14. The interior space 14 is used to house one or more function modules 5. The intermediate housing 2 has a cuboid third interior space 15. The interior space 15 is used to house interfaces for the devices to be connected. In the first and second interior spaces 13, 14, guides 16 are formed. The guides 16 are designed as rails. The guides 16 serve for holding the function modules 5. Two opposing guides 16 in each case serve to hold one function module 5. Several guides 16 are arranged on top of each other, so that the function modules 5 can be housed stacked in the cuboid interior spaces 13, 14. The first and second interior spaces 13, 14 are adapted to the size of the function modules 5 in terms of their extension in the longitudinal direction. The counterpart of the clip connection is formed at the intermediate housing 2 by several recesses corresponding to the snap hooks 17. In addition, the intermediate housing 2 has several snap hooks 18, which are used for form-fitting fastening of the back wall 6. Also, the intermediate housing 2 has several snap hooks 19 for the form-fitting holding of the main board 4. The recesses 17 are formed on the snap hooks 19.

FIG. 7 shows that the main board 4 is inserted in the intermediate housing 2 and is hooked in via a snap-in or clip connection of the snap hooks 19. The unit 3 is snapped to the front of the intermediate housing 2. In addition, the unit 3 can be fastened via a threaded connection 20 (cf. FIG. 8) to the intermediate housing 2.

Figures 8, 9, 10:
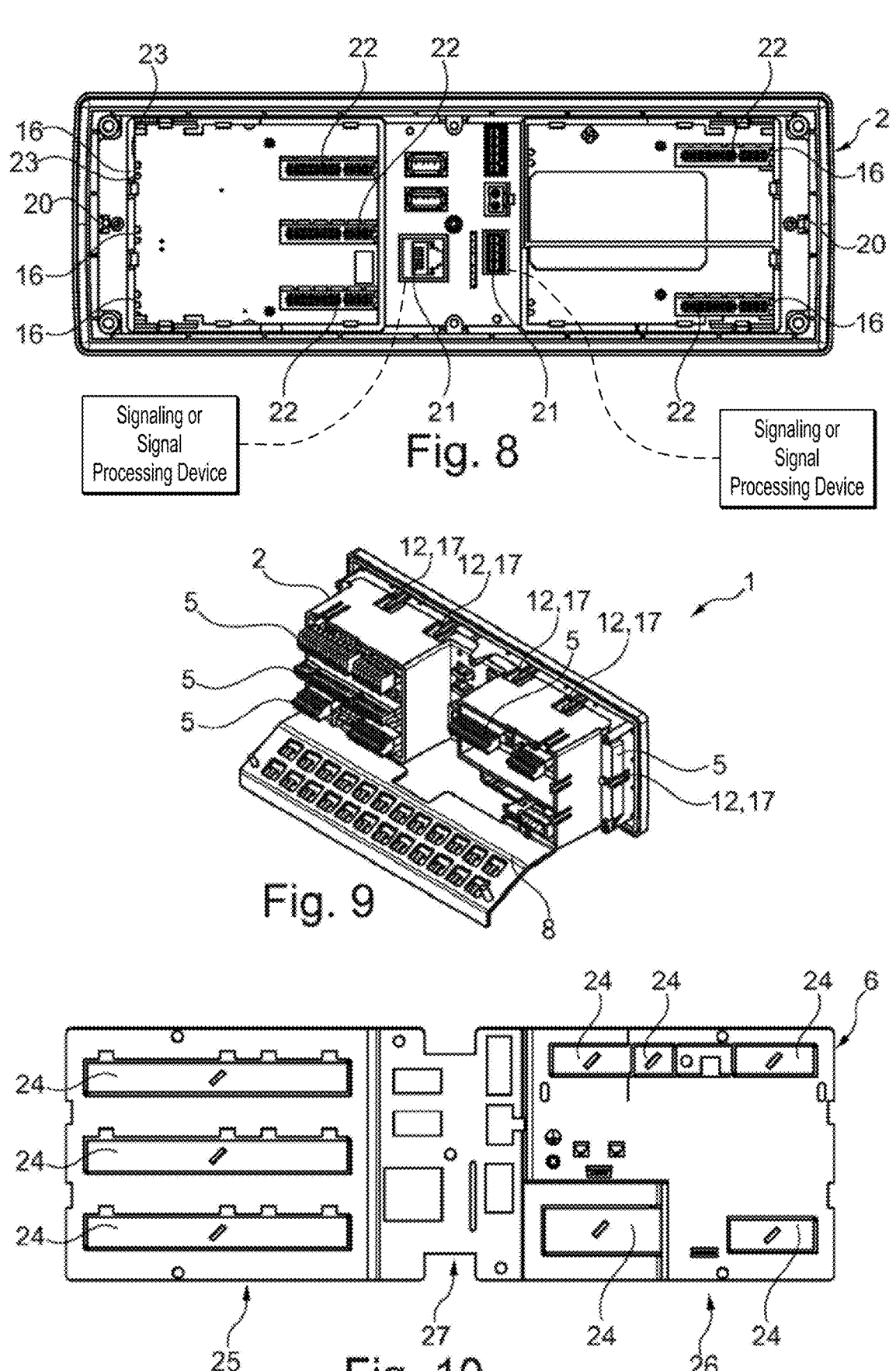
FIG. 8 is a rear view of a main board of the appliance for installation.
FIG. 9 is a perspective view of the appliance for installation from the back.
FIG. 10 is a rear view of a back wall of the appliance for installation.

FIG. 8 shows a rear-side view of the appliance for installation 1, in which the structure of the main board 4 can be seen. The main board 4 has at least one interface 21, here, several interfaces 21. The interfaces 21 are arranged in a width-oriented central section of the main board 4. The interfaces 21 can be designed as analog and/or digital interfaces. The interfaces 21 are used to connect the devices 40. For example, the interfaces 21 can be used to connect a USB WLAN stick, an USS Ethernet stick, a USB radio module, a USB Bluetooth stick or the like.

The main board 4 has at least one input interface 22, here, several input interfaces 22. The input interfaces 22 are used for receiving one function module 5 each. The function module 5, for example, is connected to the input interface 22 via a plug connection. The function module 5 is designed, for example, as an option card or a memory card or the like, which is inserted into one of the input interfaces 22 also referred to as slots. On both sides of the input interfaces 22 in the width direction, one of the guides 16 is arranged. Each guide 16 is formed similar to a rail by two projections 23 offset in the vertical direction to each other, between which the function module 5 can be inserted. This way, the function module 5 is guided in particular when being inserted and kept stable after assembly. In the present embodiment, several function modules are stacked on top of each other.

FIG. 9 shows the appliance for installation 1 with the mounted shield plate 8. The shield plate 8 is form-fittingly attached to the intermediate housing 2, here via a clip connection. The shield plate 8 can be attached to an underside of the intermediate housing 2 (cf. FIG. 9) or to an upper side of the intermediate housing 2 (cf. FIG. 13). The shield plate 8 has at least two sections that are inclined to each other. In the assembled state, the one section extends parallel to an underside or upper side of the intermediate housing 2 and the other section is inclined outwards, i.e., away from the appliance for installation. Depending on the manner of installation, the shield plate 8 is fixed in one of the two positions.

FIG. 10 shows the back wall 6. The back wall 6 has several cover plates 24, which can be separated out as required. The cover plates 24 are of different sizes and are adapted to the respective interface 21 or interface 22 to be covered. In a first section 25 of the back wall 6, which covers the first interior space 13 of the intermediate housing 2, three cover plates 24 are formed to cover input interfaces 22 for the function modules 5. In a second section 26 of the back wall 6, which covers the second interior space 14 of the intermediate housing 2, several cover plates 24 of different sizes are arranged for the input interfaces 22. In a third section 27 of the back wall 6, which covers the (middle) third interior space 15 of the intermediate housing 2, several cover plates 24 of different sizes are formed for the interfaces 21. The back wall 6 is adapted to the exterior shape of the intermediate housing 2 and is adjacent to it (cf. FIGS. 11 and 12). Accordingly, the middle third section 27 of the back wall is formed offset in the longitudinal direction to the first section 25 and the second section 26. The back wall 6 is used for shielding and grounding the components accommodated in the intermediate housing 2. In particular, the back wall 6 serves as a ground connection of all modular function modules 5.

Figures 11, 12, 13, 14, 15, 16:
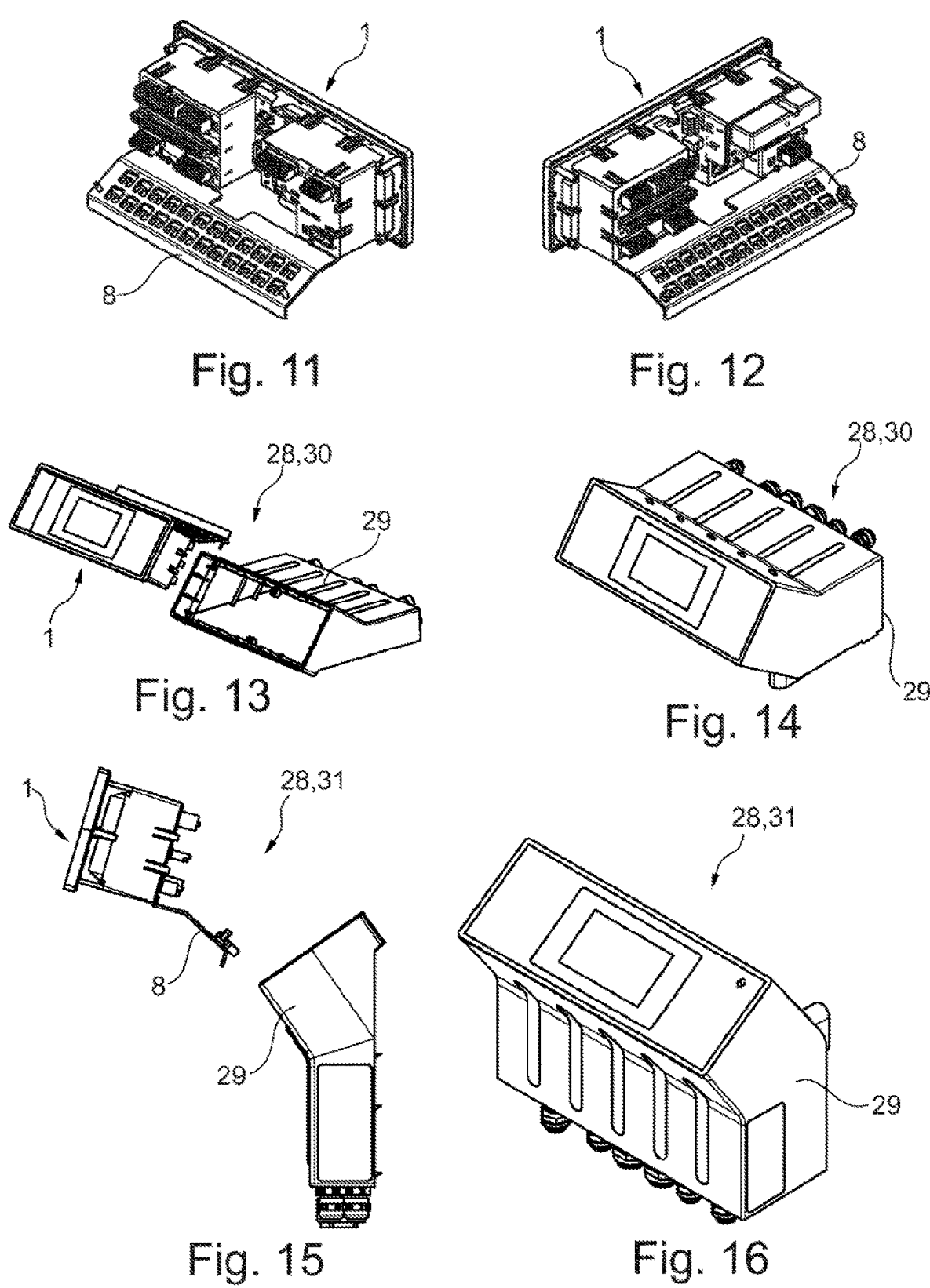
FIGS. 11 and 12 are perspective views of the appliance for installation during assembly.
FIGS. 13 and 14 show an inventive processing apparatus with the appliance for installation designed as a tabletop device.
FIGS. 15 and 16 show the processing apparatus designed as a wall-mounted device.

FIGS. 13 to 15 show an inventive (data) processing apparatus 28. The processing apparatus 28 is used for controlling, measuring and/or regulating. The processing apparatus 28 is also referred to as controller or control device, measuring device and/or regulating device. The processing apparatus 28 comprises the appliance for installation 1 and an outer housing 29. The appliance for installation 1 is received in the outer housing 29. In particular, the appliance for installation 1 is frictionally attached in the outer housing 29. As an alternative to the outer housing 29, the appliance for installation 1 can be attached with the retaining frame 7 (see FIG. 2). In this case, for example, the appliance for installation 1 can be housed directly in a control cabinet or other console.

The processing apparatus 28 can be used as a tabletop device 30 (cf. FIGS. 13 and 14) or as a wall-mounted device 31 (cf. FIGS. 15 and 16). The appliance for installation 1 can be inserted in the outer housing 29 either in a first position, or in a second position rotated by 180° with respect to the first position about an axis perpendicular to the screen of the unit 3. As a result, the same outer housing 29 can be used for two different applications or different positions. In the first position, the tabletop device 30 is formed, which, placed on a table, can be operated by a user, etc. In the second position, the wall-mounted device 31 is formed, which, attached to a wall, can be operated by a user, etc.

The processing apparatus 28 is designed in several parts. The individual components of the processing apparatus 28 can preferably be non-destructively detached from each other. The individual components are preferably form-fittingly attached to each other or to the outer housing 29. Furthermore, the outer housing may be multi-part, preferably in two parts. The individual parts of the outer housing, such as an upper and a lower part, can be additionally connected to each other by means of safety ropes, not shown, such as nylon ropes. If maintenance, installation, or removal of a function module 5 or other work on the processing apparatus 28 is required in the industrial environment, the sensitive electronic components are thus secured. The upper part of the outer housing 29 with the appliance for installation 1 mounted therein does not need to be removed and additionally protected in dusty and dirty environments.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A processing apparatus for controlling, measuring and/or regulating, comprising:
   an appliance for installation for output and/or input to control, measure and/or regulate processes of signal processing devices that are connectable to the appliance for installation, the appliance for installation including an intermediate housing, a unit for display and/or operation and a main board connected to the unit,
   wherein the main board has a central computer unit,
   wherein interfaces are provided in the main board to connect the main board to the signal processing devices,
   wherein the appliance for installation is modularly equipped with one or more function modules selected from a variety of function modules,
   wherein additional interfaces are provided in the main board, the additional interfaces being input interfaces for receiving and connecting the function modules, and wherein the function modules each have an interface to the signal processing devices, and
   wherein the unit for display and/or operation is mounted to a front side of the main board and the interfaces to connect the main board to the signal processing devices are provided on a rear side of the main board.

2. The processing apparatus according to claim 1, wherein the unit for display and/or operation is form-fittingly, non-destructively connectable to the intermediate housing and non-destructively detachable from the intermediate housing.

3. The processing apparatus according to claim 1, wherein the interfaces of the main board, provided to connect the main board to the signal processing devices, are analog and/or digital interfaces.

4. The processing apparatus according to claim 1, wherein the function modules are non-destructively connected via plug connections with the input interfaces and non-destructively detached from the input interfaces.

5. The processing apparatus according to claim 1, wherein the intermediate housing has guides in which the function modules are guided.

6. The processing apparatus according to claim 1, wherein the appliance for installation has a back wall, which is form-fittingly, non-destructively connectable to the intermediate housing and non-destructively detachable from the intermediate housing.

7. The processing apparatus according to claim 1, wherein the appliance for installation and/or the unit are designed so as to be rotatable about an axis perpendicular to a display screen of the unit, by 180° or 90°.

8. The processing apparatus according to claim 1, wherein the appliance for installation is frictionally connectable to an outer housing of the processing apparatus and/or a retaining frame of the processing apparatus.

9. The processing apparatus according to claim 1, wherein the intermediate housing is formed as a tube housing, which comprises at least one cuboid interior space for housing at least one of the function modules and/or the interfaces.

10. The processing apparatus according to claim 6, wherein the back wall has detachable cover plates, each covering a respective one of the interfaces and the input interfaces of the main board.

11. The processing apparatus according to claim 8, wherein the outer housing is multi-part, wherein components of the outer housing are connectable to each other form-fittingly and detachable from each other.

12. The processing apparatus according to claim 8, wherein the appliance for installation is attached in the outer housing either in a first position or in a second position rotated by 180° with respect to the first position about an axis perpendicular to a display screen of the unit.

13. The processing apparatus according to claim 8, wherein the outer housing, in which the appliance for installation is housed, is attachable to a wall or placed on a table.

14. A processing apparatus for controlling, measuring and/or regulating, comprising:

an appliance for installation for output and/or input to control, measure and/or regulate processes of signaling or signal processing devices that are connectable to the appliance for installation, the appliance for installation including an intermediate housing, a unit for display and/or operation and a main board connected to the unit, wherein the main board has a central computer unit, wherein interfaces are provided in the main board to connect the main board to the signaling or signal processing devices, wherein the appliance for installation is modularly equipped with one or more function modules selected from a variety of function modules, wherein additional interfaces are provided in the main board, the additional interfaces being input interfaces for receiving and connecting the function modules, and wherein the function modules each have an interface to the signaling or signal processing devices, wherein the unit for display and/or operation is mounted to a front side of the main board and the interfaces to connect the main board to the signaling or signal processing devices are provided on a rear side of the main board, wherein the intermediate housing is formed as a tube housing, which comprises at least one cuboid interior space for housing at least one of the function modules and/or the interfaces, and wherein the appliance for installation has a back wall that is adapted to a shape of the intermediate housing and serves as a ground connection for all of the function modules.

15. A processing apparatus for controlling, measuring and/or regulating, comprising:

an appliance for installation for output and/or input to control, measure and/or regulate processes of signaling or signal processing devices that are connectable to the appliance for installation, the appliance for installation including an intermediate housing, a unit for display and/or operation and a main board connected to the unit, wherein the main board has a central computer unit, wherein interfaces are provided in the main board to connect the main board to the signaling or signal processing devices, wherein the appliance for installation is modularly equipped with one or more function modules selected from a variety of function modules, wherein additional interfaces are provided in the main board, the additional interfaces being input interfaces for receiving and connecting the function modules, and wherein the function modules each have an interface to the signaling or signal processing devices, wherein the unit for display and/or operation is mounted to a front side of the main board and the interfaces to connect the main board to the signaling or signal processing devices are provided on a rear side of the main board, wherein the appliance for installation has a back wall, which is form-fittingly, non-destructively connectable to the intermediate housing and non-destructively detachable from the intermediate housing, and wherein the back wall has a plurality of openings, each of the plurality of openings corresponding to a respective one of the interfaces and the input interfaces.

* * * * *